United States Patent
Lian et al.

Patent Number: 6,083,788
Date of Patent: Jul. 4, 2000

[54] STACKED CAPACITOR MEMORY CELL AND METHOD OF MANUFACTURE

[75] Inventors: Jenny Lian, Wallkill; Gerhard Kunkel, Fishkill, both of N.Y.

[73] Assignee: Infineon Technologies North America Corp., San Jose, Calif.

[21] Appl. No.: 09/277,669

[22] Filed: Mar. 26, 1999

[51] Int. Cl.[7] .............................................. H01L 21/8242
[52] U.S. Cl. .......................... 438/253; 438/258; 438/396; 438/241; 438/243; 438/399; 438/3
[58] Field of Search ........................................ 438/253, 459, 438/3, 928, 251, 243–258, 396, 397, 398, 241, 399, 244, 246, 152; 257/306, 308, 310, 626, 381, 385, 303, 756, 774, 295, 296

[56] References Cited

U.S. PATENT DOCUMENTS

| | | | |
|---|---|---|---|
| 5,066,608 | 11/1991 | Kim et al. | 438/244 |
| 5,266,512 | 11/1993 | Kirsch | 438/253 |
| 5,661,063 | 8/1997 | Lee | 438/253 |
| 5,793,076 | 8/1998 | Fazan et al. | 257/298 |
| 5,828,097 | 10/1998 | Tanigawa | 257/306 |
| 6,011,284 | 1/2000 | Katori et al. | 257/295 |

*Primary Examiner*—Matthew Smith
*Assistant Examiner*—Igwe Anya
*Attorney, Agent, or Firm*—Stanton C. Braden

[57] ABSTRACT

A DRAM memory cell structure of a Metal-Oxide-Semiconductor Field Effect Transistor (MOSFET) and a stacked capacitor and a method for forming same facilitates low resistance contact between the source/drain of the transistor and a lower electrode of the capacitor. The method in its preferred embodiment uses platinum for the bottom electrode of the capacitor without the need for a diffusion barrier between it and a doped polysilicon plug used to contact the MOSFET. To this end, the formation of the contact is after the deposition of the high dielectric material, such as barium strontium titanate, used to form the dielectric of the capacitor. Also the bottom electrode of the capacitor is partially offset with respect to the polysilicon plug.

13 Claims, 4 Drawing Sheets

STACKED CAPACITOR MEMORY CELL AND METHOD OF MANUFACTURE

FIELD OF INVENTION

This invention relates to the manufacture of semiconductive devices, and more particularly, to such devices that utilize a multilayer stack on the top surface of a semiconductor chip to form a capacitor that is to be serially connected in the semiconductor chip to a region that extends to the top surface of the semiconductor chip.

BACKGROUND OF THE INVENTION

Currently a variety of semiconductor integrated circuit devices include capacitors as circuit elements. Typical of such integrated circuit devices are dynamic random access memories (DRAM) that utilize as the memory cell a capacitor as a storage element in series with a switch provided by a Metal Oxide Semiconductor Field Effect Transistor (MOSFET). Such memory cells are formed in dense large arrays in the semiconductive chip. In a popular form of DRAM the storage capacitor of the memory cell is formed as a multilayer stack on the top surface of a silicon chip and the switch is an MOSFET in the chip adjacent its top surface. The lower plate of the capacitor stack serves as the storage node of the capacitor and a source/drain region of the transistor serves as the storage node of the switch and the two storage nodes are connected together advantageously by as low a resistance as is feasible. To this end, the capacitor is generally aligned so that its storage node overlies the source/drain region of the transistor and a conductive plug, typically of highly doped polysilicon, is used to interconnect the capacitor lower plate (electrode) and the transistor source/drain region.

In such a structure, the deposition of the layers to form the capacitor stack, which generally includes a pair of layers of a high conductivity metal, such as platinum, and an intermediate layer of material of a high dielectric constant, such as barium strontium titanate, generally needs to be done at a high temperature in an oxygen-containing atmosphere. Unfortunately, under such circumstances there is a tendency for the bottom plate of the capacitor, typically an electrode of platinum or other similar metal, such as iridium, palladium, ruthenium, or silver, to react with the conductive polysilicon plug used for the contact with undesirable results to the properties of the contact. To avoid this reaction, it is common to insert a diffusion barrier layer of a material, such as titanium nitride or tantalum nitride, between the doped polysilicon plug and the electrode. However, this diffusion barrier does add undesirable resistance to the connection between the two storage nodes. This resistance degrades the signal to noise ratio and thus reduces overall yield which increases cost.

The present invention seeks to ameliorate this problem.

SUMMARY OF THE INVENTION

The present invention ameliorates the problem by modifying the process of forming the connection between the source/drain region of the transistor and the bottom plate of the capacitor to avoid the need for the diffusion barrier between the capacitor electrode and the conductive plug, advantageously of doped polysilicon. One modification is that the capacitor stack is essentially completely formed before there is formed the conductive polysilicon plug so that there is avoided the need for any further heating to high temperatures in an oxygen-containing atmosphere that might affect the interface between the platinum and the silicon. As a consequence, there is avoided the need for a diffusion barrier between the capacitor electrode and the polysilicon plug. Additionally, as another modification, the bottom electrode of the capacitor is partially misaligned with the polysilicon plug. This misalignment facilitates providing a barrier free connection between the polysilicon plug and the platinum bottom electrode of the capacitor.

Viewed from a method aspect, the present invention is directed to a method for making a semiconductive device. The method comprises the steps of: preparing a silicon substrate that has a top surface where there are located spaced apart plurality of doped silicon regions to each of which a separate stacked capacitor is to be serially connected; forming a dielectric first layer over said top surface; forming in said dielectric layer for each of said plurality of doped silicon regions to form part of a conductive second layer, a separate conductive plug that extends vertically through said layer to contact one of said regions; forming a dielectric third layer over a top surface of the resulting stack; forming a conductive fourth layer over a top surface of the resulting stack; patterning the conductive fourth layer to leave over said dielectric third layer, a plurality of conductive segments, one for each conductive plug in partially offset alignment with the conductive plug, each suitable for serving as the bottom electrode of a stacked capacitor; forming over the resulting stack including the conductive segments a dielectric fifth layer of material suitable for serving as the dielectric of the stacked capacitor being formed; forming a conductive sixth layer over the resulting stack; forming a planarized dielectric seventh layer over the resulting stack; patterning in turn the seventh, sixth, fifth, and third and layers to form in the stack a plurality of separate openings each exposing the top portion of a conductive plug that is not underlying a segment of the conductive fourth layer; and providing in each separate opening conductive material for connecting the exposed top portion of each conductive plug selectively to a separate segment of the conductive fourth layer.

Viewed from an apparatus aspect, the present invention is directed to a memory cell that includes a transistor in a semiconductive chip and a stacked capacitor over a top surface of the semiconductive chip in which the bottom electrode of the stacked capacitor is a metal layer that makes a low resistance connection to a source/drain region of the transistor, characterized in that said connection is free of a diffusion barrier and is made between a conductive plug that overlies the source/drain region of the transistor and a metal bottom electrode of the capacitor, the bottom electrode of the capacitor being partially offset from the conductive plug. Advantageously, the metal electrode is of platinum, the conductive plug is of doped polysilicon, and the capacitor dielectric is of a material, such as barium strontium titanate, that has a high dielectric constant.

The invention will be better understood from the following more detailed description taken in conjunction with the accompanying drawing.

Figure 1:
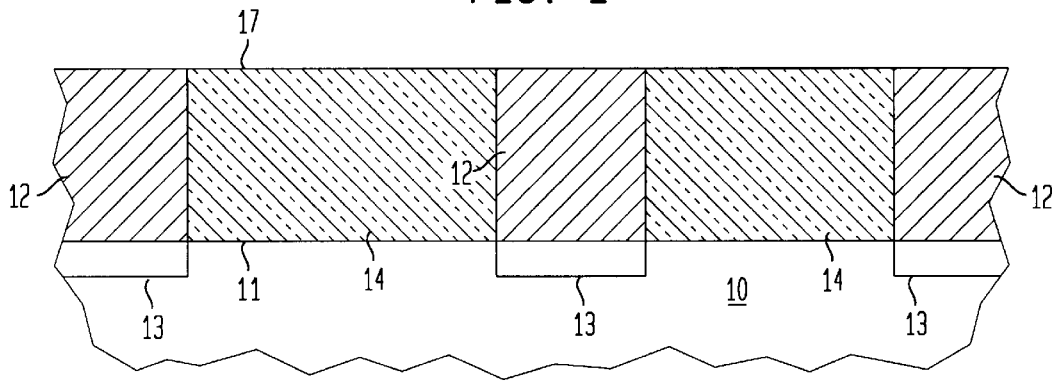
FIGS. 1–9 illustrate the formation of a a connection between a polysilicon plug and the bottom electrode of a stacked capacitor that is only partially aligned with the polysilicon plug in accordance with the invention.

It is to be noted that the drawing is not to scale.

DETAILED DESCRIPTION

With reference now to the drawing, FIG. 1 shows a portion of a silicon wafer (substrate) 10 that will be diced eventually into a plurality of silicon chips, each of which includes a plurality of memory cells arrayed to form a DRAM. The portion shown will be a portion of one such chip and includes over a top surface 11 thereof a series of polysilicon plugs 12, each of which is doped to be highly conductive. Each plug 12 is positioned to pass through an opening in the silicon oxide layer 14 that extends over the top surface of the silicon chip and to extend downward and make a low resistance connection to a source/drain region 13 of a silicon transistor in the chip. This region 13 serves as the storage node of a memory cell. Typically there will also be along the top surface of the chip other n-type doped regions (not shown) that will serve as the drain/source regions of the transistors. An insulating layer 16, also typically of silicon oxide, extends over the top surface of layer 14.

There are various possibilities for forming a structure of the kind shown. Typically in the silicon chip 10 adjacent to the top surface 11 there is first formed in any suitable fashion, an N-MOSFET that includes a source/drain region 13, after which the top surface 11 is covered with a first layer 14 of silicon oxide. Then an opening with essentially vertical sidewalls is formed in the silicon oxide layer 14, centered over each source/drain region 13, typically by anisotropic reactive ion etching (RIE). Then doped polysilicon as a second layer is deposited over the surface of layer 14 to fill its opening with the plugs 12. To insure a complete fill, it is generally the practice to overfill, after which the top surface is planarized, typically by chemical mechanical polishing (CMP). After the planarization of the deposited polysilicon layer, the polysilicon plug 12 is only in the opening and shares a common surface 17 with layer 14, as is shown in FIG. 1.

Figure 2:
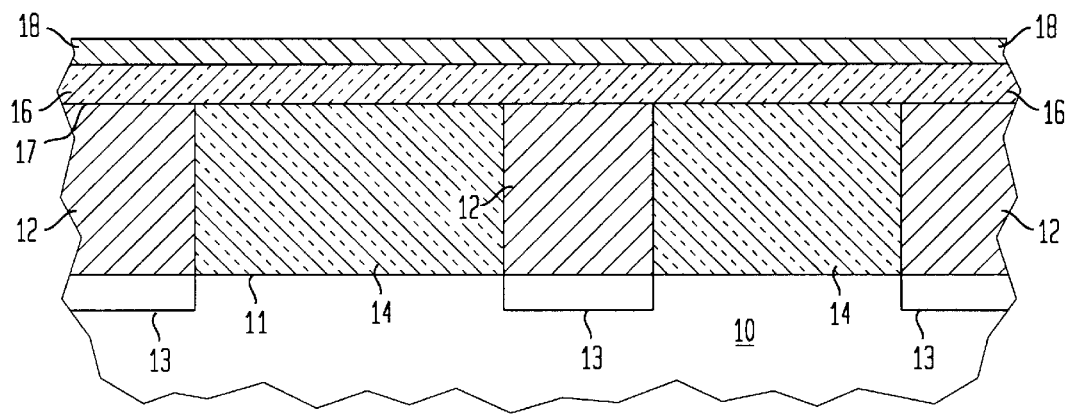

There is then deposited in turn over the surface 17, a third layer 16 of a dielectric, typically silicon nitride, and a fourth layer 18 of a conductor, advantageously, platinum, suitable for serving as the bottom plate of the future stacked capacitor to form the stacked structure as is shown in FIG. 2.

Figure 3:
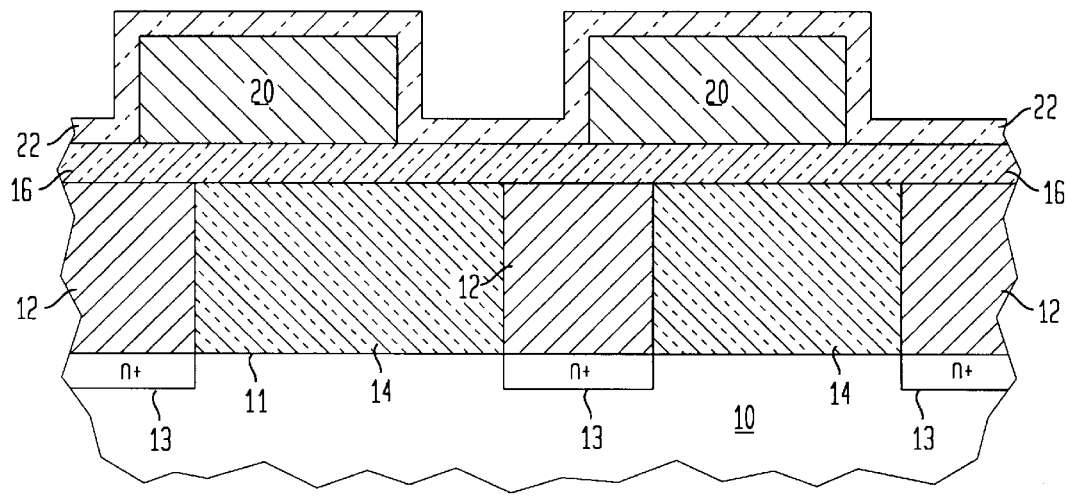

This platinum layer 18 is then patterned to divide the layer into individual segments 20, one for each capacitor, as is shown in FIG. 3. The segments 20 are spaced apart and each segment is in offset alignment with a plug so as to overlap part of a different polysilicon plug 12. Each segment 20 will serve as a bottom electrode of a stacked capacitor. The etch of the platinum layer 18, which divides it into segments 20, stops at the dielectric layer 16.

Next there is deposited a fifth layer 22 of a material with a high dielectric constant, such as barium strontium titanate, over a top surface of the resulting stacked structure, as is shown in FIG. 3. The deposition, which typically is done at a high temperature in an oxygen-rich atmosphere, will now little affect the polysilicon plug 12 because it is essentially encased in protective silicon nitride and so not in contact with platinum. The thickness of the layer 22 deposited should be suitable to its role as the capacitor dielectric.

Now there is deposited over dielectric layer 22 a sixth layer 24 of a metal, suitable for use as the top electrode of the capacitor, advantageously of platinum. Also feasible are iridium, palladium, ruthemium, or silver.

Figure 4:
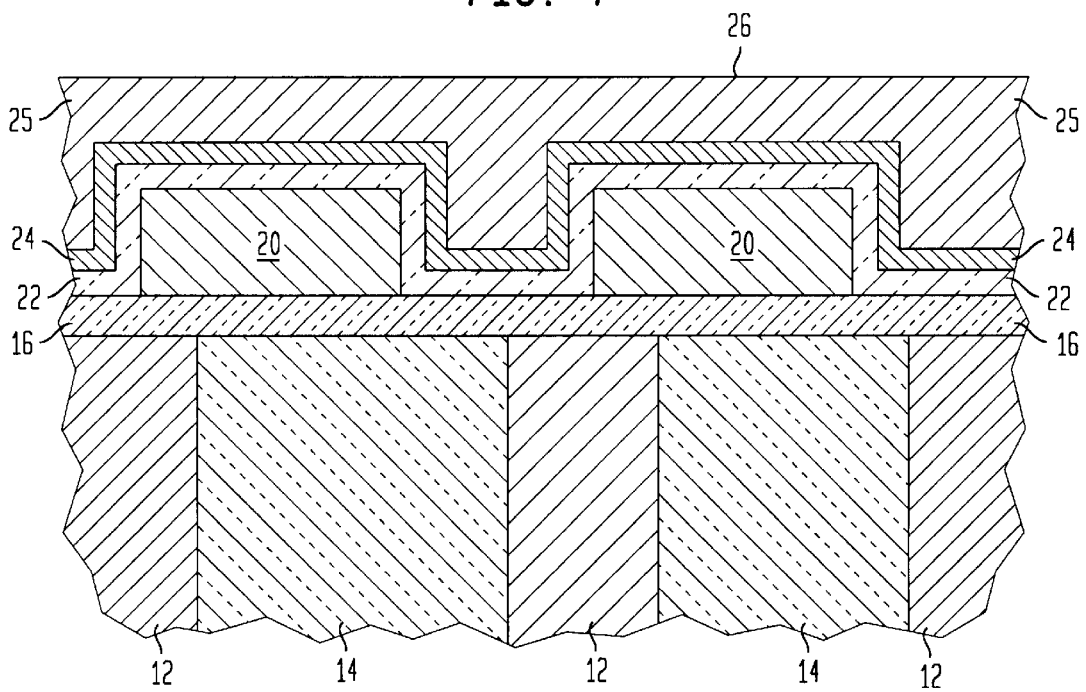

Then there is deposited over the top surface of the resulting structure a seventh layer 25 of a dielectric, such as TEOS or a silicate glass, that can be deposited at relatively low temperature, after which its top surface 26 is planarized to arrive at the structure shown in FIG. 4.

Figure 5:
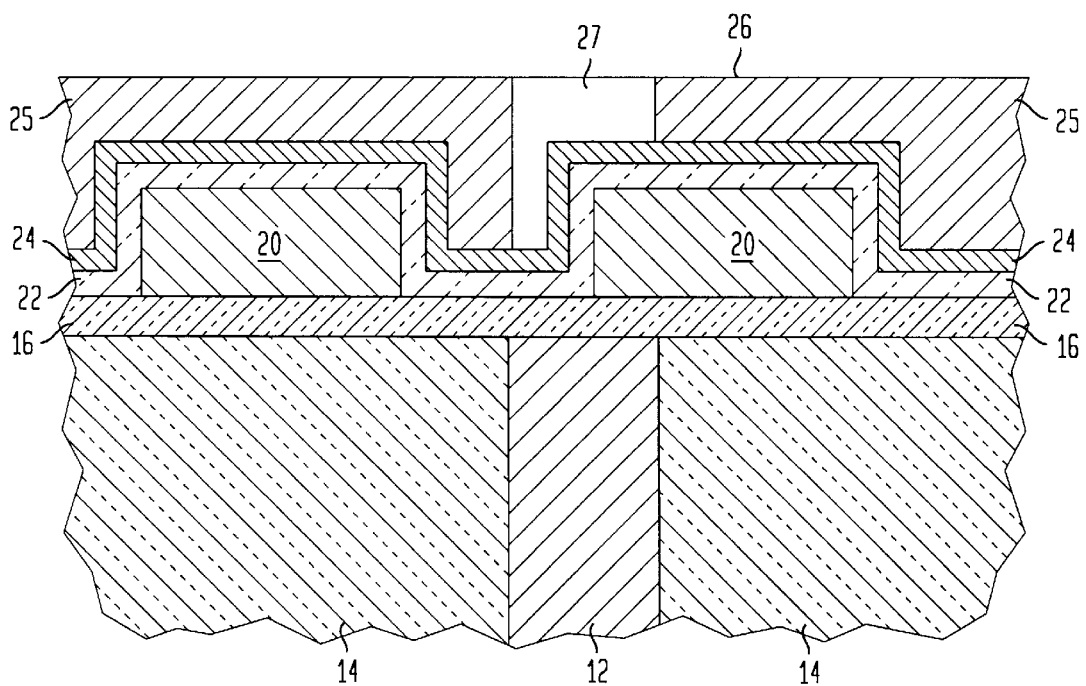

Then separate openings 27 are formed in the dielectric layer 25 that are essentially aligned with the plugs 12, as is shown in FIG. 5. At this point, each opening 27 terminates at the top of conductive sixth layer 24.

Figure 6:
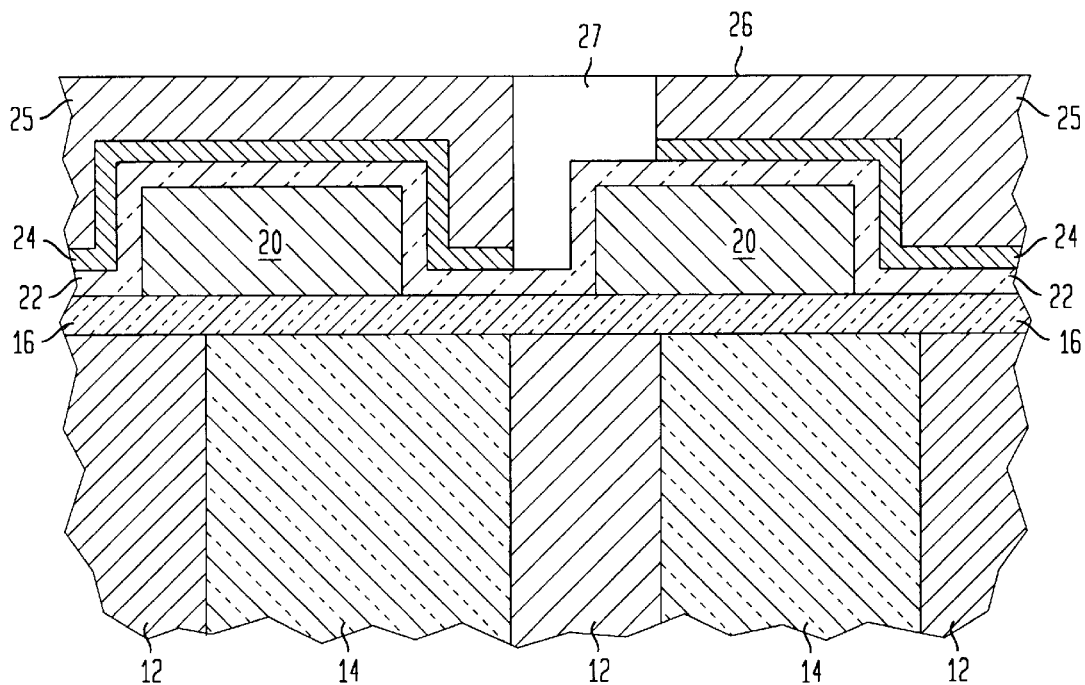

Next there is additional etching to remove the portion of metal layer 24 in each opening 27, as shown in FIG. 6.

Figure 7:
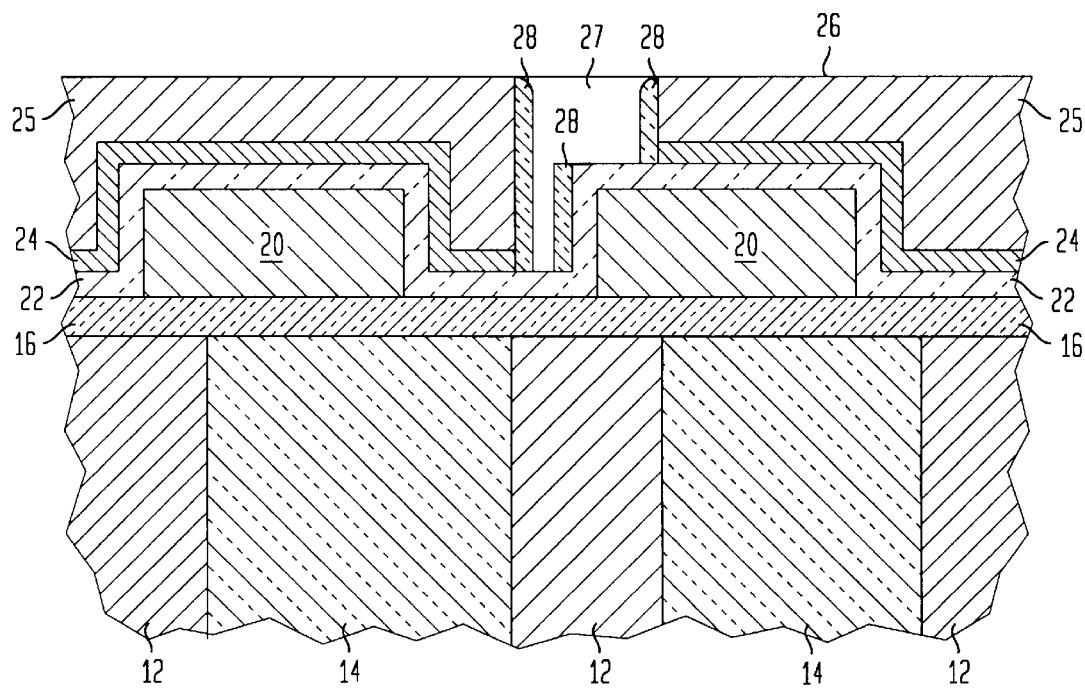

This is followed by the deposition of a dielectric liner layer 28, typically of either silicon oxide or silicon nitride, on the side walls of the openings 27, as is shown in FIG. 7. Layer 28 will later serve to prevent an electrical short of the capacitor.

Figure 8:
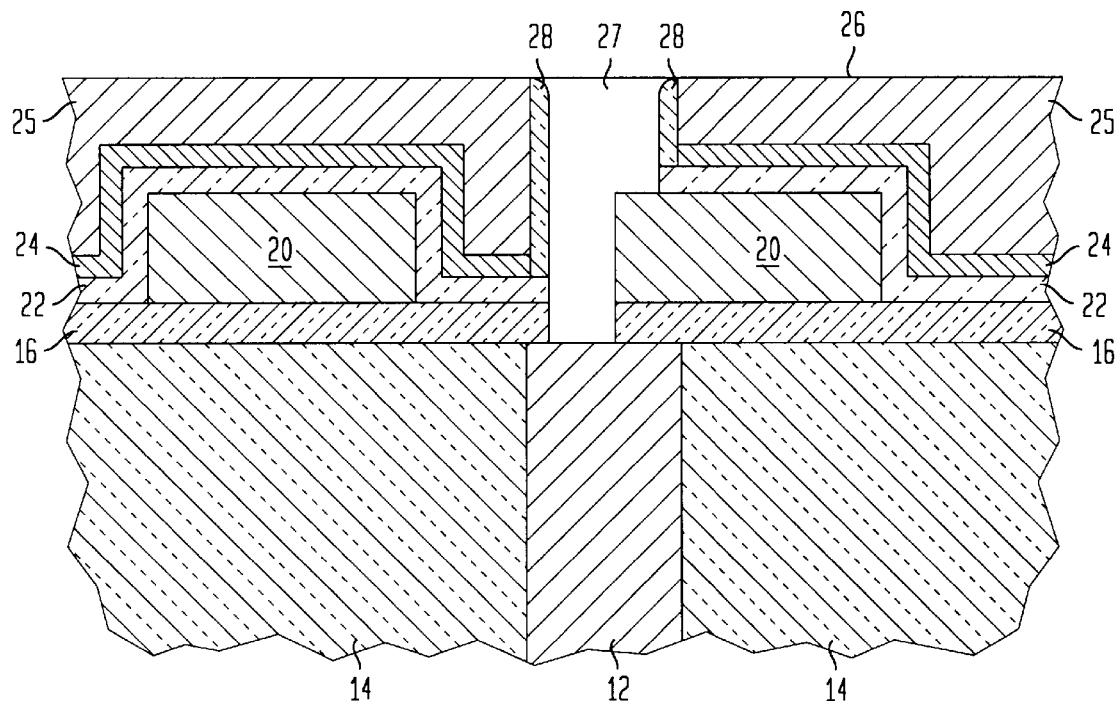

Next, the bottom of each opening 27 is cleared of dielectric layer 22 and dielectric layer 16 to expose a portion of the top of the doped polysilicon plugs 12, as is shown in FIG. 8. This typically is done suitably by localized reactive ion etching in known fashion.

Figure 9:
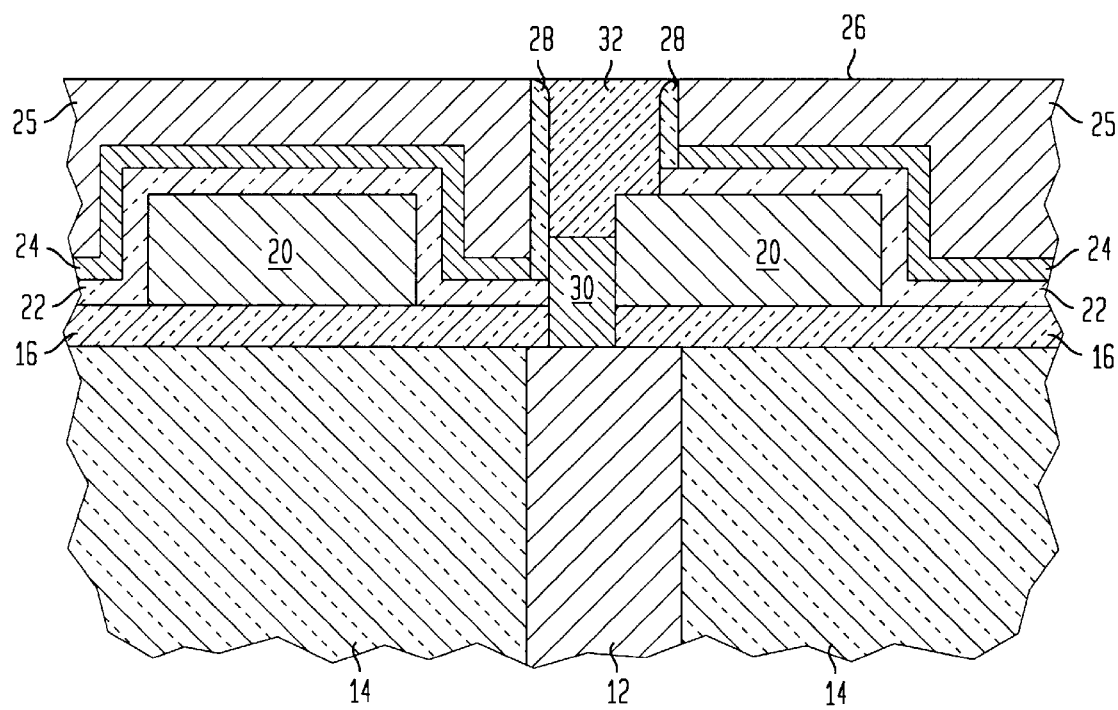

Now, as is shown in FIG. 9, a conductive contact 30 is deposited in each cleared opening 27 and then etched back to provide a low resistance connection at the bottom of the opening between the bottom electrode 18 and the doped polysilicon plug 12. The conductive contact 30 should not contact the upper electrode layer 24 of the adjacent capacitor, and the liner 28 serves this purpose. The material for this contact 30 can be any conductor that can be conveniently be deposited and etched back, such as doped polysilicon.

The rest of opening 27 is then filled with a suitable capping material 32, such as TEOS or a silicate glasses, as shown in FIG. 9. It is generally easier to overfill and then to planarize the surface to the level of the capping layer 25.

It is characteristic of the process described that there is avoided the exposure of the interface between the bottom electrodes 18 and the polysilicon plugs 12 to a high temperature oxygen ambient by forming the interface late in the process and after the deposition of the layer 22 of the high dielectric material, such as barium strontium titanate, that requires such an ambient. Accordingly, there is no need for the diffusion barrier layer previously used to limit undesirable diffusion between the polysilicon plug and the chosen metal, advantageously platinum.

Moreover, the partial offset in alignment of the bottom electrode 18 of each stacked capacitor with respect to the polysilicon plug 12 provides wide tolerance in the processing and makes it easy to assure that each bottom capacitor electrode contacts only a single plug.

It is to be understood that the a specific process described is illustrative of the general principles of the invention and that various modifications may be devised in the process described without departing from the spirit and scope of the invention. In particular, it should be feasible to substitute different materials from those mentioned in the illustrative embodiment. For example, other dielectrics, such as barium titanate, lead zirconium titanate, or strontium bismuth tantalate, may be used instead of barium strontium titanate and other metals substituted for platinum, such as inidium, palladium, ruthenium, or silver. Also for the conductive plug, conductors other than doped polysilicon may be used such as tungsten, aluminum, or titanium nitride.

What is claimed is:

1. A method for making a semiconductive device comprising the steps of:

preparing a silicon substrate that has a top surface where there are located spaced apart plurality of doped silicon regions to each of which a separate stacked capacitor is to be serially connected;

forming a dielectric first layer over said top surface;

forming in said dielectric layer for each of said plurality of doped silicon regions to form part of a conductive second layer, a separate conductive plug that extends vertically through said layer to contact one of said regions;

forming a dielectric third layer over a top surface of the resulting stack;

forming a conductive fourth layer over a top surface of the resulting stack;

patterning the conductive fourth layer to leave over said dielectric third layer, a plurality of conductive segments, one for each conductive plug in partially offset alignment with the conductive plug, each suitable for serving as the bottom electrode of a stacked capacitor;

forming over the resulting stack including the conductive segments a dielectric fifth layer of material suitable for serving as the dielectric of the stacked capacitor being formed;

forming a conductive sixth layer over the resulting stack;

forming a planarized dielectric seventh layer over the resulting stack;

patterning in turn the seventh, sixth, fifth, and third layers to form in the stack a plurality of separate openings each exposing the top portion of a conductive plug that is not underlying a segment of the conductive fourth layer; and providing in each separate opening conductive material for connecting the exposed top portion of each conductive plug selectively to a separate segment of the conductive fourth layer.

2. The method of claim 1 in which the patterning of the seventh, sixth, fifth, and third layers in turn involves first patterning the seventh layer, then patterning the sixth layer, then providing a dielectric liner in the sidewalls of the patterned opening, and then patterning the fifth and third layers.

3. The method of claim 2 in which the conductive fourth layer is of platinum and the dielectric fifth layer is of barium strontium titanate.

4. The method of claim 1 in which the forming of the conductive plugs in the first dielectric layer involves depositing the conductive material to overfill openings in the first dielectric layer and then planarizing the surface.

5. The method of claim 4 in which the conductive plug is of doped polysilicon.

6. The method of claim 4 in which the conductive plug is chosen from the group of conductors including doped polysilicon, tungsten, aluminum, and titanium nitride.

7. The method of claim 4 in which the conductive fourth layer is of platinum.

8. The method of claim 7 in which the conductive material provided in each separate opening for connecting a top portion of each conductive plug to a separate segment of the conductive fourth layer is of doped polysilicon.

9. the method of claim 4 in which the conductive fourth layer is chosen from the group of conductors that include platinum, iredium, palladium, ruthenbium, or silver.

10. The method of claim 4 in which the dielectric fifth layer is of barium strontium titanate.

11. The method of claim 4 in which th dielectric fifth layer is chosen from the group that includes barium strontium titanate, lead zirconium titanate, strontium bismuth tantalate, or barium titanite.

12. A memory cell that includes a transistor in a semiconductive chip and a stacked capacitor over a top surface of the semiconductive chip in which the bottom electrode of the stacked capacitor is a metal layer that makes a low resistance connection to a source/drain region of the transistor, characterized in that said connection is free of a diffusion barrier and is made between a conductive plug that overlies the source/drain region of the transistor and a metal bottom electrode of the capacitor, the bottom electrode of the capacitor being partially offset from the conductive polysilicon plug.

13. The memory cell of claim 12 in which the bottom capacitor electrode of the capacitor is of platinum, the dielectric layer of the capacitor is of barium strontium titanate, and the conductive plug is of doped polysilicon.

* * * * *